(12) United States Patent
Kou

(10) Patent No.: US 7,272,896 B2
(45) Date of Patent: Sep. 25, 2007

(54) DATA TRANSFER BETWEEN MOISTURE SENSORS

(75) Inventor: Yuen-Foo Michael Kou, Andover, MA (US)

(73) Assignee: Accu-Assembly Incorporated, Andover, MA (US)

( * ) Notice: Subject to any disclaimer, the term of this patent is extended or adjusted under 35 U.S.C. 154(b) by 0 days.

(21) Appl. No.: 11/061,589

(22) Filed: Feb. 18, 2005

(65) Prior Publication Data

US 2006/0185187 A1 Aug. 24, 2006

(51) Int. Cl.
F26B 13/10 (2006.01)
(52) U.S. Cl. .............................. 34/527; 438/15; 73/73
(58) Field of Classification Search ................ 235/375, 235/376; 438/15; 73/29.01, 73; 34/527, 34/60
See application file for complete search history.

(56) References Cited

U.S. PATENT DOCUMENTS

| 4,242,632 A | 12/1980 | Irvin |
| 4,426,619 A | 1/1984 | Demand |
| 4,684,884 A | 8/1987 | Soderlund |
| 4,728,885 A | 3/1988 | DeSanto |
| 4,939,469 A | 7/1990 | Ludwig et al. |
| 5,024,532 A | 6/1991 | Rall |
| 5,434,737 A | 7/1995 | Miura |
| 5,450,018 A | 9/1995 | Rieser et al. |
| 5,606,264 A | 2/1997 | Licari et al. |
| 5,764,073 A | 6/1998 | Sadamatsu |
| 5,867,809 A | 2/1999 | Soga et al. .................. 702/130 |
| 6,113,262 A | 9/2000 | Purola et al. |
| 6,560,839 B1 | 5/2003 | Tow |
| 6,759,862 B2 * | 7/2004 | Kou ........................... 324/763 |
| 2003/0102367 A1 | 6/2003 | Monette et al. |

FOREIGN PATENT DOCUMENTS

| JP | 61-068514 | 4/1986 |
| JP | 06042986 | 2/1994 |

OTHER PUBLICATIONS

Awtrey et al., "A1-Wire Humidity Sensor", Sensors The Journal of Applied Sensing Technology.
"Cytherm Temperature Data Logger Key", Dynasys Technologies Inc.
"Humidity Sensors Relative Humidity", Honeywell HIH Series, pp. 99, 100.
"Joint Industry Standard", IPC/JEDEC J-STD-033, Apr. 1999.

* cited by examiner

Primary Examiner—Kenneth Rinehart
(74) Attorney, Agent, or Firm—Fish & Richardson P.C.

(57) ABSTRACT

A method of monitoring electrical component moisture exposure includes calculating a remaining floor life value for a group of electrical component containers and a first container, based on an associated first moisture sensor's exposure to moisture; removing the first container from the group; creating an association between the removed first container and a second moisture sensor; and transferring the calculated remaining floor life value from the first moisture sensor for use with the second moisture sensor.

24 Claims, 4 Drawing Sheets

DATA TRANSFER BETWEEN MOISTURE SENSORS

TECHNICAL FIELD

This invention relates to transferring data between sensors, and, more particularly, to transferring data between moisture sensors.

BACKGROUND

Many expensive electronic components are packed in containers, such as trays, in which multiple discrete components are arranged in a matrix on each tray. The trays are designed so that multiple trays can be stacked together to increase the number of components positioned in one place, such as for transport or on a pick-and-place board assembly machine. During transport, each stack of trays is tied together with strapping material and packaged inside Electro-Static Discharge (ESD) bags. Typically, each stack of trays carries components of the same part number and lot code, with the part number and lot code information printed on a label attached to the outside of the bag.

Electrical components are usually placed onto printed circuit boards by a component placement machine. The most common configuration for components provided on trays is a tray tower on the placement machine. Trays of different part numbers are placed onto different 'movable' drawers inside the tray tower. At least one tray of components can be placed into each drawer. Sometimes, a stack of trays can be placed onto one drawer and the placement machine can remove the tray on the top of the stack after all the components on the top tray are consumed. The placement machine selects different part numbers by moving the entire drawer assembly up and down, or otherwise positioning the pick head with respect to a desired drawer. The drawer with the desired part number is then pulled out from the tray tower for picking. In many machines, the dispensing of components is always at the same level since the pick up mechanism of the placement machine is configured to always pick up components at the same vertical position.

Depending on various parameters, a particular electrical component may be more or less sensitive to being damaged during exposure to reflow soldering conditions based on exposure to moisture. The term "reflow soldering conditions" refers generally to the environmental conditions associated with a process of securing electrical components to a circuit board, substrate or other supporting structure. In a typically reflow soldering process, the electrical components may be exposed to an elevated temperature for some period of time. Dry storage containers may be provided to store electrical components over an extended period of time. However, an electrical component may be exposed to varying levels of ambient moisture prior to being reflow soldered to an electrical assembly.

Electrical components may be supplied in containers other than trays.

SUMMARY OF THE INVENTION

Various aspects of the invention feature methods of monitoring electrical component moisture exposure. In one aspect, the method includes calculating, with a first moisture sensor, a remaining floor life value associated with a group of electrical component containers and an associated first container, based on the first moisture sensor's exposure to moisture over time. The method also includes removing the first container from the group and creating an association between the removed first container and a second moisture sensor. The calculated remaining floor life value associated with the group of electrical component containers is then transferred for use with the associated second moisture sensor.

In some implementations, the method includes calculating, with the second moisture sensor, a remaining floor life value associated with the removed first container, based on the removed first container's exposure to moisture. The transferred remaining floor life value associated with the group may be used as an initial value for calculating the remaining floor life value associated with the removed first container.

Certain embodiments include recoupling the removed first container to the group of electrical component containers. In that instance, a new association is created between the recoupled first container and the first moisture sensor. Also, an updated remaining floor life value associated with the first container is transferred from the second moisture sensor to the first moisture sensor. The first moisture sensor may then calculate a remaining floor life value associated with the recoupled first container, based on the first moisture sensor's exposure to moisture. The calculation of remaining floor life of the recoupled first container may include using the remaining floor life value transferred from the second moisture sensor as an initial value for the calculation.

In some implementations the method includes determining suitability of an electrical component of the removed first container for exposure to reflow soldering conditions based on a value of remaining floor life associated with the removed first container calculated by the second moisture sensor. The suitability determination may be accomplished as a component is being removed from the first container for placement onto a circuit board. The method also may include reflow soldering a suitable electrical component from the removed first container to a circuit board or interrupting reflow soldering activities upon an unfavorable suitability determination.

According to certain embodiments, after removing the first container from the group, the method includes using the first moisture sensor to continue calculating a remaining floor life value associated with the group.

Transferring the calculated remaining floor life value for use with the second moisture sensor may include transferring the remaining floor life value to a computer that is coupled to the second moisture sensor.

In other implementations, the method includes collecting moisture exposure data with the second moisture sensor. The collected data may be associated with the removed first container's exposure to moisture. The data can be transferred to an associated computer and calculating a remaining floor life associated with the removed first container, based on the transferred moisture data and using the transferred remaining floor life value as an initial remaining floor life value.

In some embodiments, the method includes, prior to calculating the remaining floor life value associated with the group, creating an association between the first moisture sensor and the group of electrical component containers. Creating the association may include securing the first moisture sensor to a container in the group.

Creating the association between the removed first container and the second moisture sensor may include placing the removed first container in an area proximate the second moisture sensor.

Certain implementations include setting the first moisture sensor to an initial remaining floor life value of 100% prior to calculating the remaining floor life value associated with the group. The calculations may be performed periodically or approximately continuously while the first container is associated with the first moisture sensor.

Some embodiments include initiating the transferring of data by actuating a switch at the first moisture sensor. This may include positioning a magnetic element proximate the first moisture sensor to actuate the switch.

Another aspect of the invention features a system for monitoring electronic component moisture exposure. The system includes a first moisture sensor associated with a group of electrical component containers and a second moisture sensor associated with an electrical component placement machine. The first moisture sensors is adapted to sense exposure to moisture over time, calculate, based on the sensed exposure, a remaining floor life value of the associated group of containers and transfer an updated remaining floor life value of the associated group to the second moisture sensor upon removal of a first container from the associated group of containers.

In certain implementations, the first moisture sensor includes a hall effect sensor adapted to activate the transfer of the updated remaining floor life value when a magnetic element is positioned proximate the first moisture sensor.

According to some embodiments the second moisture sensor is adapted to receive the transferred remaining floor life value from the first moisture sensor, to set, as an initial floor life value of the removed first container, the received remaining floor life value and to periodically update the floor life value, over time, based on the removed first container's exposure to moisture over time.

In some implementations, the system also includes a computer coupled to the second moisture sensor. The computer is adapted to determine suitability of components from the first tray for exposure to reflow conditions based on the updated floor life value. In certain implementations, the computer may be adapted to monitor the remaining floor life associated with multiple different containers at the same time. Each of those containers may be associated with the second moisture sensor.

In some implementations, one or more of the following advantages may be present. The frequency of electrical component damage due to the expansion of trapped moisture during reflow soldering and other manufacturing processes may be minimized. The accuracy of predicting potential damage to electrical components prior to exposing the electrical components to reflow soldering may be improved. A large amount of historical data relating to moisture exposure may be collected. This may provide a database of information to assist manufacturers in making well informed decisions regarding whether an electrical component is suitable for exposure to reflow soldering. Improved reliability of electrical assemblies may be realized.

Other features and advantages will also be apparent from the following description and drawings.

DETAILED DESCRIPTION

Figure 1:
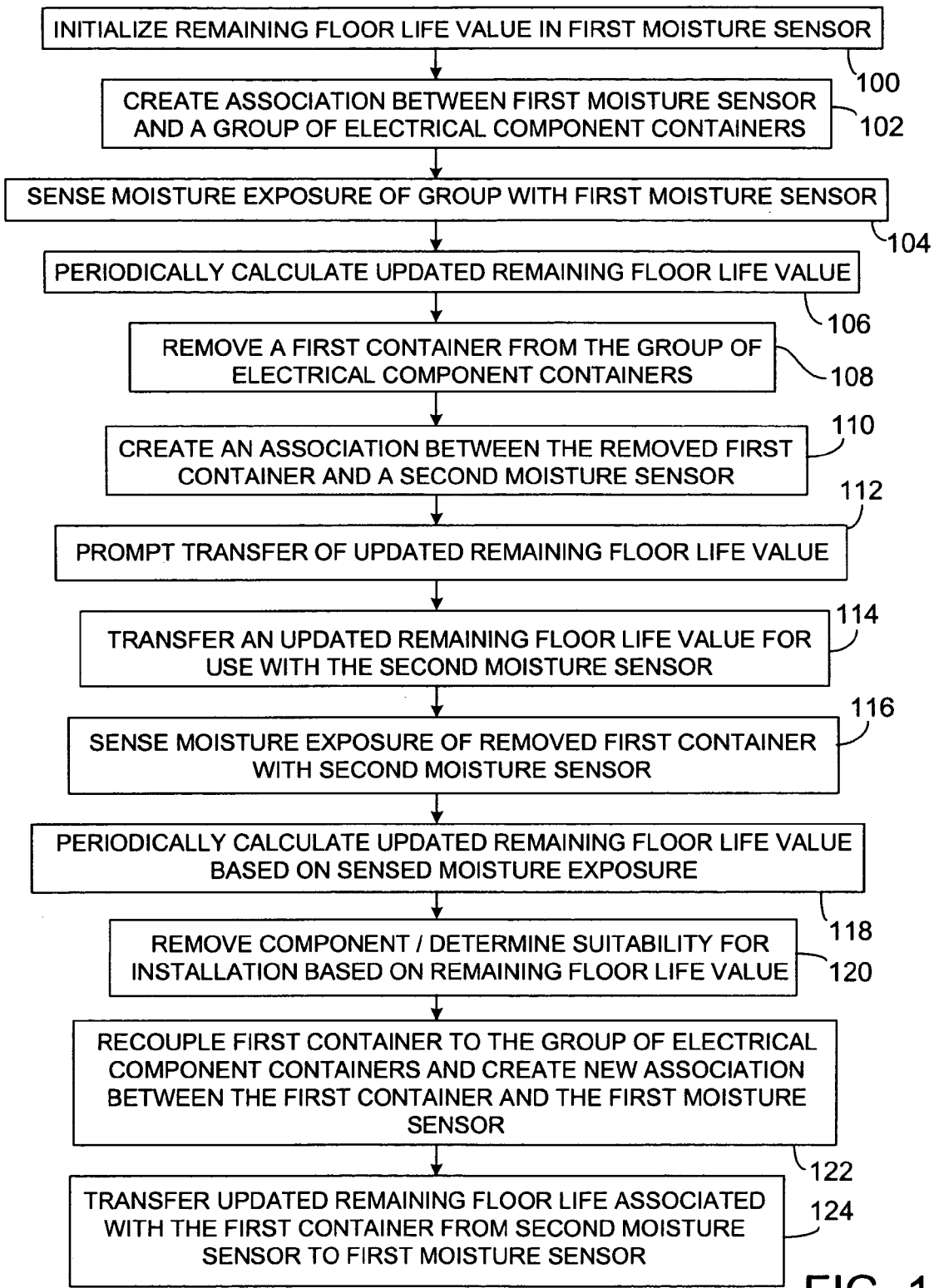
FIG. 1 is a flowchart of a method of monitoring moisture exposure of electrical components.

Referring to FIG. 1, a method of monitoring moisture exposure of electrical components arranged on a plurality of component containers (e.g., trays) will be described. The illustrated method is modifiable in ways that will be readily understood by those possessing ordinary skill in the art. The method includes initializing 100 a remaining floor life value in a first moisture sensor. According to one embodiment, the first moisture sensor can sense moisture exposure and calculate an associated reduction of remaining floor life for a corresponding group of electrical components over time based on the sensed moisture exposure. The first moisture sensor may use the initialization value for remaining floor life value as a starting point in performing those calculations. The initial value of remaining floor life may be, for example, 100%. Alternatively, other values of remaining floor life may be used as a starting point for remaining floor life calculations.

The illustrated method includes creating 102 an association between a group of electrical component containers and the first moisture sensor. In some instances it may be desirable to perform this step as close in time to initializing the remaining floor life value as is possible. The group of electrical component containers may be, for example, a stack of electrical component trays. Typically, each container would be adapted to carry one or more electrical component thereupon, and each tray would be adapted for being coupled to an electrical component placement machine. The association between the group of electrical component container and the first moisture sensor may be created, for example, by physically securing the first moisture sensor to one of the containers in the group.

In accordance with the illustrated method, the first moisture sensor then begins sensing 104 moisture exposure of the group of electrical component containers with the first moisture sensor. According to one implementation, sensing proceeds continuously once started. Alternatively, sensing may occur periodically. For example, sample points may be collected once every few seconds. The process of sensing may include measuring one or more data parameters that may indicate ambient moisture content. Such parameters include, for example, temperature and relative humidity. Data indicating the sensed moisture exposure may be stored in the first moisture sensor's internal memory storage unit as it is collected. Techniques for collecting and storing moisture exposure data were disclosed in U.S. Pat. No. 6,759,862 (Kou), entitled *Method and Apparatus for Evaluating a Set of Electronic Components*, which is hereby incorporated by reference in its entirety. Other techniques for collecting and storing moisture exposure data will be apparent to one of skill in the art in light of this disclosure.

As illustrated, the first moisture sensor periodically calculates 106 an updated remaining floor life value. This periodic updating may be performed at an approximately continuous rate. Alternatively, the remaining floor life value may be updated, for example, every few seconds. In order to update the remaining floor life value, the first moisture sensor may calculate 104 a reduction in remaining floor life that the electrical components in the associated group experienced during a particular time period (e.g., a few seconds) that the first moisture sensor sensed data. Once a reduction in remaining floor life associated with a particular period of time is calculated, the first moisture sensor may decrement the previous remaining floor life value accordingly. To perform reduction in remaining floor life calculations, the first moisture sensor may implement standard techniques, such as those described in Joint Industry Standard, IPC/ JEDEC J-STD-033A, *Handling, Packing, Shipping and Use of Moisture/Reflow Sensitive Surface Mount Devices.*

The remaining floor life calculations may take into consideration particular physical characteristics of electrical components in the associated group. Accordingly, such physical characteristics should be available for reference to the first moisture sensor. In one implementation, an operator enters data about those physical characteristics into the first moisture sensor either manually or otherwise. In another implementation, the first moisture sensor is preprogrammed with such data corresponding to a particular type of electrical component.

According to the illustrated method, an operator removes 108 a first container from the group. For illustrative purposes, it is assumed that the removed first container is not the container to which the first moisture sensor had been coupled.

As illustrated, the operator then creates 110 an association between the removed first container and a second moisture sensor, which may be functionally quite similar to the first moisture sensor. This association may be created, for example, by coupling the removed first container to an electrical component placement machine, where the second moisture sensor is located. The association may be created simply as a result of the operator's placement of the first container near the second moisture sensor. For example, if the operator couples the removed first container to an electrical component placement machine, then the second moisture sensor might be one that is positioned at least proximate the electrical component placement machine. In that instance, the second moisture sensor might be rigidly mounted to a wall near the electronic component placement machine. Alternatively, the second moisture sensor might be rigidly mounted to the electrical component placement machine itself. Generally, however, the second moisture sensor should be positioned in a manner that would be make it suitable for monitoring ambient moisture conditions associated with the location where the removed first container is to be placed after removing it from the group.

According to an alternative embodiment, the second moisture sensor may be secured directly to the removed first container.

According to the illustrated implementation, the operator prompts 112 the moisture sensor to transfer an updated remaining floor life value for use with the second moisture sensor. In one embodiment, it is desirable that the prompting occurs at about the same time the operator removes the first container from the group. Such prompting might involve manipulating a switch at the first moisture sensor to initiate the transfer. For example, the first moisture sensor may include an internal hall effect sensor that is sensitive to magnetism. The hall effect sensor may be coupled to an internal transmitter. In that implementation, the operator may prompt the moisture sensor to transfer the updated remaining floor life value by positioning a magnetic element proximate the first moisture sensor so as to actuate the hall effect sensor to, in turn, start the internal transmitter. Alternatively, other means for initiating the transfer may be implemented.

The transfer destination (e.g., the second moisture sensor or a computer coupled for communication with the second moisture sensor) as well as information identifying which container of the group is being removed may be entered by the operator. Alternatively, such information may be preprogrammed into the first moisture sensor or elsewhere in the system.

According to illustrated method, upon prompting, the first moisture sensor transfers 114 an updated remaining floor life value for use with the second moisture sensor. The updated remaining floor life value may simply be the last value of remaining floor life that was calculated by the first moisture sensor prior to transferring. Alternatively, the transfer-prompting by the operator might also prompt the first moisture sensor to perform a final calculation of remaining floor life. In that instance, the result of the final calculation may be transferred to the second moisture sensor upon prompting.

The first moisture sensor also may transfer, upon prompting, identification information relating to the electrical components of the container being removed. Such information might include, for example, component part numbers, lot numbers, physical dimensions, and moisture characteristics. Alternatively, such information might include an identification of the position (i.e., drawer) on the electrical component placement machine that the container is destined for, from which component identification information may be obtained from an associated database: Such information may be received by and stored in the second moisture sensor.

The illustrated method includes sensing 116 moisture exposure of the removed first container with the second moisture sensor. The sensing may continue, for example, during the entire time that the first container is coupled to the electrical component placement machine. The second moisture sensor may store data representing the sensed moisture exposure in an internal memory unit. Alternatively, the second moisture sensor may transmit the data it collects on a periodic basis to a remote computer for storage and further processing. For purposes of illustration, it is assumed that the second moisture sensor stores the data it collects locally. It should be noted that, since the second moisture sensor is fixed in one position, it may be hard-wired to a long-term power source, such as an electrical wall outlet.

As illustrated, the second moisture sensor periodically calculates 118 updated remaining floor life values associated with the first container. The second moisture sensor may use the remaining floor life value that was transferred from the first moisture sensor as a starting point for the periodic updates. As in the first moisture sensor, these periodic updates may be performed on an approximately continuous basis. The methods for calculating reductions in remaining floor life may be similar to those discussed above with reference to the first moisture sensor. Such calculations may be performed by either the second moisture sensor or by the remote computer, to which the second moisture sensor is coupled. Certain triggering events may cause such calculations to occur. Possible triggering events include, for example, the placement machine removing an electrical component from the first container, the component installation program indicating that a component from the first container should be placed on a circuit board, or a signal from a timing circuit.

The second moisture sensor (or the remote computer) may use component identification data (including moisture sensitivity information) and the time-based moisture exposure data collected by the second moisture sensor to update the remaining floor life value.

The illustrated method includes, at step 120, removing a component from the first container for placement on a circuit board and determining suitability of the removed component for exposure to reflow soldering conditions. According to one implementation, the removal is performed by the electrical component placement machine. The suitability determination may include, for example, comparing the latest remaining floor life value associated with the container, from which the component is removed, to a predetermined value, which may be an acceptability limit. If the total remaining floor life is greater than the predetermined value, the electrical component may be deemed suitable for exposure to reflow soldering conditions. The predetermined value of remaining floor life may be, for example, 50% of original floor life. Alternatively, the value may be 30% of original floor life. Alternatively, the value may be 10% of original floor life. Alternatively, the value may be approximately 0% of original floor life.

In one embodiment, the suitability determination is accomplished by a remote computer coupled for communication to the second moisture sensor. In another embodiment, the suitability determination is performed by the second moisture sensor itself. If it is determined that a particular electrical component is suitable for exposure to reflow soldering conditions, then the electrical component placement machine is permitted to couple the electrical component to a destination circuit board for subsequent exposure to reflow soldering conditions.

If, however, it is determined that an electrical component is not suitable for exposure to reflow soldering conditions, then the electrical component placement machine may alert the operator. Depending on the particular implementation, this may include triggering an audio and/or visual alarm, shutting down the component placement machine, or halting picking operations from the affected container of electrical components. One of skill in the art might recognize other ways in which an electrical component placement machine might react to an unfavorable suitability determination.

The illustrated method also includes recoupling 122 the first container to the group of electrical component containers. Recoupling may simply include removing the first container from the electrical component placement machine and placing it in an area proximate the original group of containers, such that it will be exposed to similar environmental conditions as the original group of containers. Recoupling also may include stacking the first container back onto the original group of containers in a dry storage area. An operator may recouple the first container if, for example, the electrical component placement machine no longer requires the type of components stored on the first container to be available for placement. As the first container is recoupled to the original group of containers, a new association is created between the recoupled first container and the first moisture sensor.

After recoupling and creating the new association, the illustrated method includes transferring an updated remaining floor life value associated with the first container from the second moisture sensor to the first moisture sensor. The first moisture sensor then periodically updates a remaining floor life value associated with the recoupled first container, based on sensed moisture exposure. The first moisture sensor also continues periodically updating the remaining floor life value associated with the containers that were never removed from the group. In that instance, the first moisture sensor would be performing two sets of remaining floor life calculations, one set for the original group of containers (less the first container) and another set of calculations for the recoupled first container. The calculations for the recoupled first container may use the remaining floor life value transferred from the second moisture sensor to the first moisture sensor as an initial value.

Figure 2A:
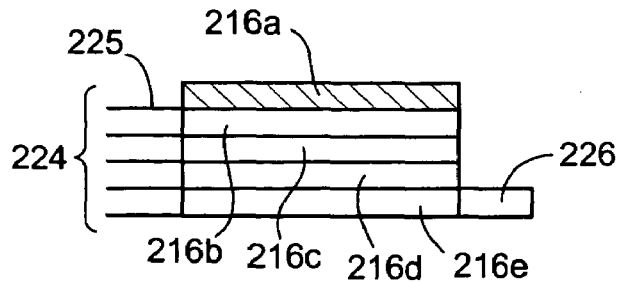
FIG. 2A-2E illustrates moisture sensors coupled to electrical component containers.
Figure 4:
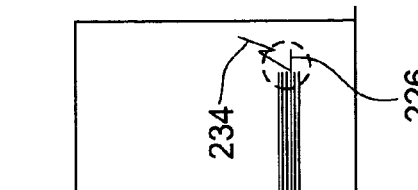
FIG. 4 illustrates a bar code.

Referring to FIG. 2A, a first container 216a of electrical components is coupled to a group 224 of electrical component containers 216b-216e. A first moisture sensor 226 is associated with the group 224 and with the first container 216a. The association exists by virtue of the first moisture sensor 226 being physically attached to a container (i.e., container 216e) of the group 224. The first moisture sensor 226 is adapted to sense moisture exposure and to periodically update a remaining floor life value of the associated group 224 and first container 216a based on sensed moisture exposure. An initial value of remaining floor life may be entered into the first moisture sensor when the first moisture sensor is first associated with the group 224 and the first container 216a. Each container 216a-e carries an identification tag 225 in the form of a bar code label (see FIG. 4) on its upper surface. The tags 225 are all placed in a common orientation on the stacks of trays (in this example, they all face upward).

Figure 2B:
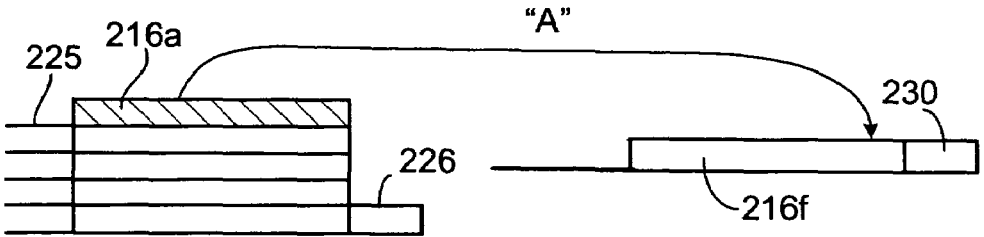

According to FIG. 2B, the first container 216a is removed (indicated by arrow "A") from the group 224 of containers and placed above another component container 216f, with which a second moisture sensor 230 is associated. An association is thereby established between the removed first container 216a and the second moisture sensor 230. In some implementations, the removed first container 216a may be coupled directly to an electrical component placement machine. In such instances, the second moisture sensor may not be actually coupled to another component container. Instead, the second moisture sensor 230 may be positioned near the machine in such a manner as to facilitate sensing ambient moisture conditions of the machine.

Figure 2C:
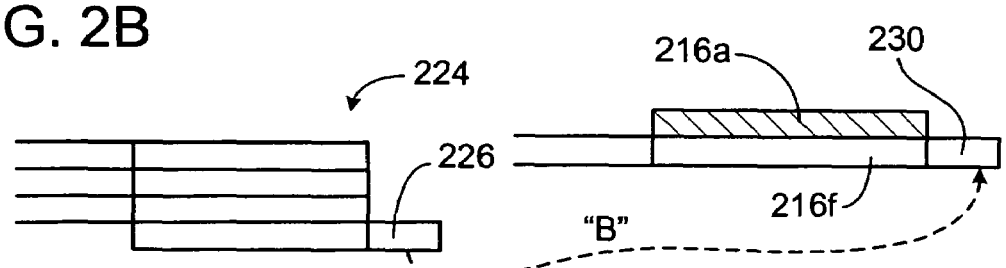

At approximately the same time that the first container 216a is removed from the group 224, the operator may prompt the first moisture sensor 216a to transfer an updated remaining floor life value associated with the group 224 to the second moisture sensor 230. Referring to FIG. 2C, the first moisture sensor 226 transfers (indicated by dashed arrow "B") an updated value of remaining floor life to the second moisture sensor 230. According to certain implementations, the updated value of remaining floor life might be transferred to a computer coupled to the second moisture sensor 230. The transferred remaining floor life value may be used (either by the second moisture sensor 230 or by the computer coupled to the second moisture sensor 230) as a starting point for calculating and periodically updating a remaining floor life value associated with the removed first container 216a.

After the first container 216a is removed from the group, the first moisture sensor 226 continues to sense moisture exposure and periodically updates a remaining floor life associated with components of the group 224. After the first moisture sensor is associated with the second moisture sensor 230 and the updated remaining floor life value is transferred from the first moisture sensor 226 to the second moisture sensor 230, the second moisture sensor maintains and periodically updates remaining floor life values for both the first container 216a and the other container 216f. The second moisture sensor may be adapted to keep track of the exposure associated with several different containers at one time. For example, the second moisture sensor may be adapted to keep track of four or five different component containers at the same time.

According to the illustrated embodiment, the second moisture sensor 230 periodically updates the remaining floor life value associated with the removed first container 216a based on moisture exposure that it senses. During that period of time, components may be removed from the first container 216a for placement on a destination circuit board. Each time a component is removed, the second moisture sensor 230 (or a computer coupled to the second moisture sensor 230) may determine the suitability of that component for exposure to reflow conditions based on an updated remaining floor life from the second moisture sensor 230.

Figure 2D:
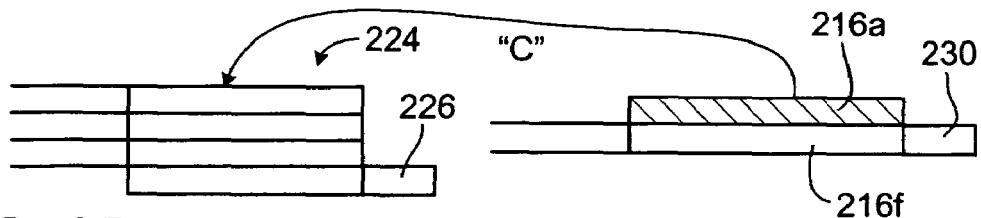

Referring now to FIG. 2D, at some later time, the first container 216a may be recoupled (indicated by arrow "C") to the original group 224 of containers. Such recoupling may be accomplished, for example, by restacking the first container 216a on top of the group 224. Alternatively, the recoupling may be accomplished by simply placing the first container 216a within the same environment as the first moisture sensor 226 (e.g., the same dry storage area).

Figure 2E:
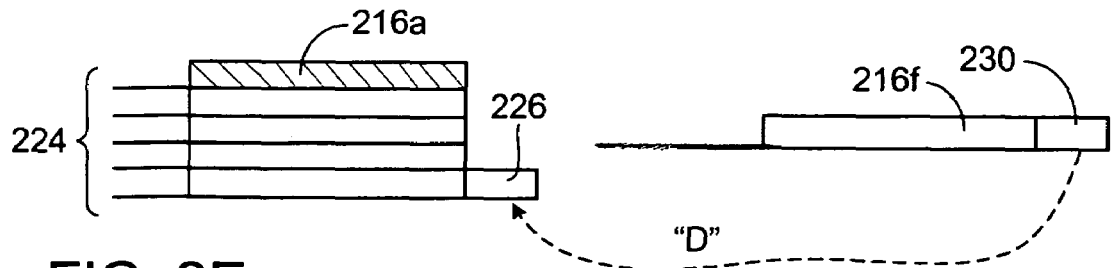

FIG. 2E illustrates the first container 216a recoupled with its original group 224 of containers. When the first container 216a is recoupled, the operator may prompt the second moisture sensor 230 to transfer an updated remaining floor life value associated with the first container 216a to the first moisture sensor 216a. The second moisture sensor 230 then may transfer (indicated by dashed arrow "D") an updated remaining floor life value to the first moisture sensor 226. A new association is thereby created between the first moisture sensor 226 and the recoupled first container 216a. Under that new association, the first moisture sensor 226 calculates and periodically updates a remaining floor life value for the recoupled first container 216a. The first moisture sensor 226 also continues calculating and periodically updating a remaining floor life value associated with the original group 224 of containers.

Figure 3:
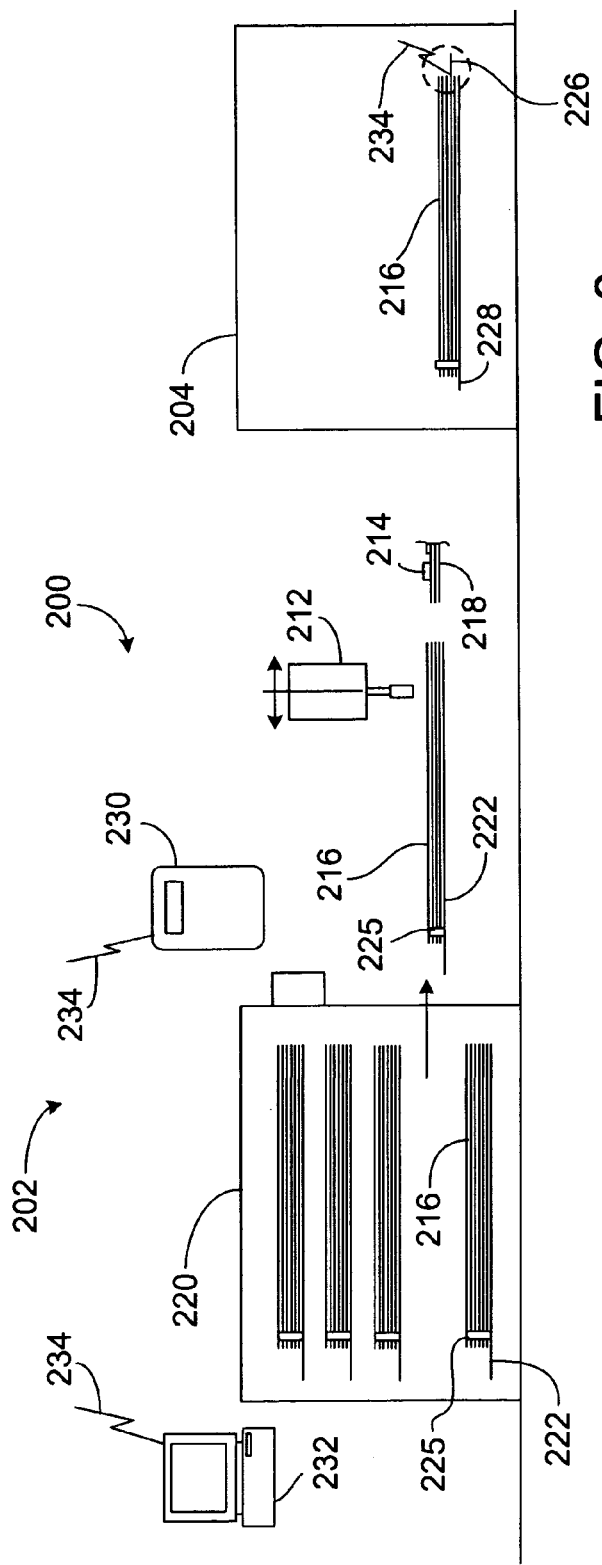
FIG. 3 illustrates an electrical component placement facility.
Figure 3:
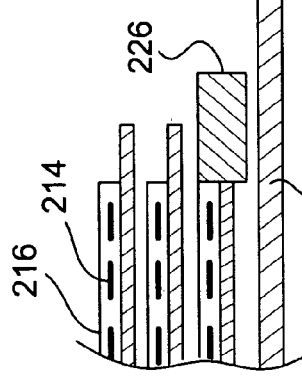

Referring to FIG. 3 a component placement facility 200 includes a storage unit 204 for extended storage of electrical component trays 216 (i.e., containers), and an electrical component placement machine 202. The storage unit 204 may be, for example, a moisture barrier bag, a safe storage means, a dry atmosphere cabinet at 5% relative humidity (or less) or a dry atmosphere cabinet at 10% relative humidity (or less). The storage unit 204 preferably provides a controlled low relative humidity atmosphere for extended storage of electrical components therein.

The electrical component placement machine 202 includes a movable pick head 212 that sequentially picks discrete electrical components 214, such as BGA (ball grid array) components, or components with discrete pins or leads, such as quad flat pack chips, for example, from a tray 216 carrying several such components, and places them on a printed circuit board 218 as part of a circuit board assembly process. Such machines are sometimes referred to as 'pick-and-place' machines. A tray tower 220 holds several trays 216 of individual components, placed on a series of drawers 222. Generally, all of the components in a stack of trays on a given drawer 222 are of the same specification, with a correspondence of drawer number and component part number stored in machine memory.

When the board build sequence requires the pick head to pick a particular component, the drawers 222 move up or down within the tray tower to place the appropriate drawer containing that component in an active position for retrieval, then the selected drawer is slid out of the tray tower and into position for access by the pick head. If the upper tray 216 of the stack of trays on the drawer is empty, some placement machines include a mechanism to remove the empty, upper tray to expose the next tray for picking.

In the system shown in FIG. 3, each tray 216 carries an identification tag 225 in the form of a bar code label (FIG. 4) on its upper surface. The tags 225 are all placed in a common orientation on the stacks of trays (in this example, they all face upward).

Figure 5:
FIG. 5 is a detail view of a moisture sensor associated with electrical component containers.

According to the illustrated embodiment, a stack 224 (i.e., group) of electrical component trays 216 (i.e., containers) is positioned on a platform 228 inside the storage unit 204. A first moisture sensor 226 is associated with and coupled to the stack 224 of electrical component trays 216. The association is achieved by the physical attachment of the first moisture sensor 226 to the lowest tray 216 in the stack 224. Referring to the detailed view of FIG. 5, the first moisture sensor 226 is slid or clipped to an edge feature of the tray 216, such that it may be removed from a discarded tray 216 and reused. In another configuration, the first moisture sensor 216 may be an integral or permanent feature of each tray 216. The first moisture sensor 226 in the illustrated embodiment is designed to slide directly onto trays 216 of the JEDEC style in common use such that no tray modifications are necessary.

The first moisture sensor 226 may include a visual indicator (e.g., a light emitting diode) to indicate whether the components of the associated group of containers are suitable for exposure to reflow soldering conditions. According to one embodiment, the storage unit 204 will include a transparent housing and the light emitting diode will be visually accessible through the transparent housing.

The first moisture sensor 226 also may includes an internal data transmitter that can be actuated, for example, by positioning a magnetic element proximate the first moisture sensor 226 (either inside the storage unit 204 or outside the storage unit 204). Once actuated, the transmitter may be adapted to transfer a remaining floor life value associated with components in the group of containers to a remote device, such as a second moisture sensor. The first moisture sensor 226 also may be adapted to transfer a suitability determination, based on a calculated remaining floor life value, to a remote device, such as a computer adapted to control an electrical component placement machine. At that time, the first moisture sensor also may transfer moisture exposure data collected over time.

According to the illustrated embodiment, a second moisture sensor 230 is positioned proximate the electrical component placement machine 202. This second moisture sensor 230 is adapted to sense moisture near the electrical component placement machine 202. The second moisture sensor 230 may be functionally quite similar to the first moisture sensor 226. In certain implementations, the second moisture sensor 230 may be adapted to receive moisture data from the second moisture sensor and calculate a remaining floor life valaue based on the received data. Such computer may be adapted to monitor the remaining floor life associated with multiple different containers at the same time. Each of those containers may be associated with the second moisture sensor 230.

According to one implementation, when the supply of a particular electrical component in the placement machine 202 is running low, an operator may retrieve one or more replacement trays 216 from the storage unit 204. When a tray 216 is removed from the stack 224 in the storage unit 204, the operator actuates the first moisture sensor's 226 internal transmitter by passing an actuating device (e.g., a magnetic element) near the first moisture sensor 226.

In response to the magnetic actuation, the first moisture sensor 226 transmits an updated remaining floor life value associated with components of the stack to a destination device, such as the second moisture sensor 230. According to one implementation, the data is transferred for use with the second moisture sensor. Identification data associated with components of the tray 216 being removed also is entered into the second moisture sensor 230. The internal transmitter of the first moisture sensor 226 transmits data to the remote computer 232 via a wireless communications channel 234.

The second moisture sensor 230 may store the remaining floor life value it receives from the first moisture sensor 226 in an internal memory storage unit, at least temporarily. The received remaining floor life value may be used as a starting point by the second moisture sensor 230 to periodically update a remaining floor life value associated with the first container. Those periodic updates may be based on the moisture content sensed by the second moisture sensor 230.

The second moisture sensor 230 also may be adapted to periodically transmit an updated remaining floor life value to the computer 232. Alternatively, the second moisture sensor 230 may be adapted to transmit data representing moisture exposure sensed by the second moisture sensor 230. Such data may be transferred, for example, periodically. In that instance, the computer 232 may be adapted to periodically update a remaining floor life value associated with the first container, while the first container is associated with the second moisture sensor 230.

In order for the second moisture sensor 230 to periodically update remaining floor life values for components of the first tray 216, information about the relevant moisture characteristics of each respective type of electrical component must be entered into the second moisture sensor 230. Such information may be transferred into the second moisture sensor 230 from the first moisture sensor 226.

In the illustrated embodiment, the second moisture sensor 230 also may be associated with other trays 216 coupled to the machine 202.

The second moisture sensor 230 might be adapted to transmit remaining floor life values to a remote device upon the occurrence of some triggering event. For example, the placement machine's assembly program might include instructions that trigger transmission by the second moisture sensor 230 whenever the pick head 212 is instructed to pick a component from the tray 216. Alternatively, an actuating element may be passed proximate a transmission actuator each time a component is picked from a particular tray 216.

In one implementation, the computer 232 is adapted to determine the suitability of electrical components from the first tray 216 for exposure to reflow soldering conditions. This determination may be made, for example, by comparing an updated remaining floor life value from the second moisture sensor to a predetermined value that represents a minimum acceptable remaining floor life. If the updated remaining floor life value is greater than the predetermined value, the computer 232 may permit the placement machine 202 to couple the subject component to a circuit board 218 for subsequent exposure to reflow soldering. On the other hand, if the updated remaining floor life value is less than the predetermined value, the computer 232 may shut down the placement machine 202, alert the operator that the particular tray 216 should be replaced or suspend picking operations at the affected tray 216 or drawer 222.

There are several methods of triggering the computer 232 to perform a suitability determination. For example, according to the illustrated embodiment, a tag reader 250 is attached to the placement machine. As the active drawer 222 slides out of the tray tower 220, its identification tag bar code label 225 may be read by a tag reader 250 (in this case, a bar code scanner) attached to the front side of the tray tower 220 and directed downward toward the opening in the tray tower through which the drawers slide. Due to the positioning of the reader, and the full overlap of the tags 225, only the identification tag of the upper tray 216 of the stack is read, as the reader is blocked from reading the identification tags of trays other than the tray at the top of the stack. When the upper tray is ejected as empty, on the subsequent motion of the tray stack out of the tray tower, tag reader 250 will read the now-exposed identification tag of the next tray of the stack. As the active drawer 222 is slid back into the tray tower, and passes back under the tag reader 250, the reader may also scan the tag of the upper tray to confirm, for example, that a tray emptied by the last pick has been properly ejected from the stack.

The tag reader 250 may be adapted to communicate the identity of the active tray to the computer 234. In that way, the computer 234 may be prompted to check that the proper data has been received with regard to components of the active tray 216. One possessing skill in the art will recognize this says that the computer 232 might recognize which tray is active.

In the event that a partially used tray 216 is removed from the placement machine 202 and returned to the storage unit 204, the returned tray 216 may be recoupled and reassociated with the original group of trays in the storage unit 204. In that instance, an updated remaining floor life value for the first tray 216 may be transferred from the second moisture sensor 230 to the first moisture sensor 226. Alternatively, the operator may attach a new, third moisture sensor (not shown) to that tray 216. In that instance, an updated remaining floor life value for the first tray may be transferred from the second moisture sensor to the third moisture sensor.

Figure 6:
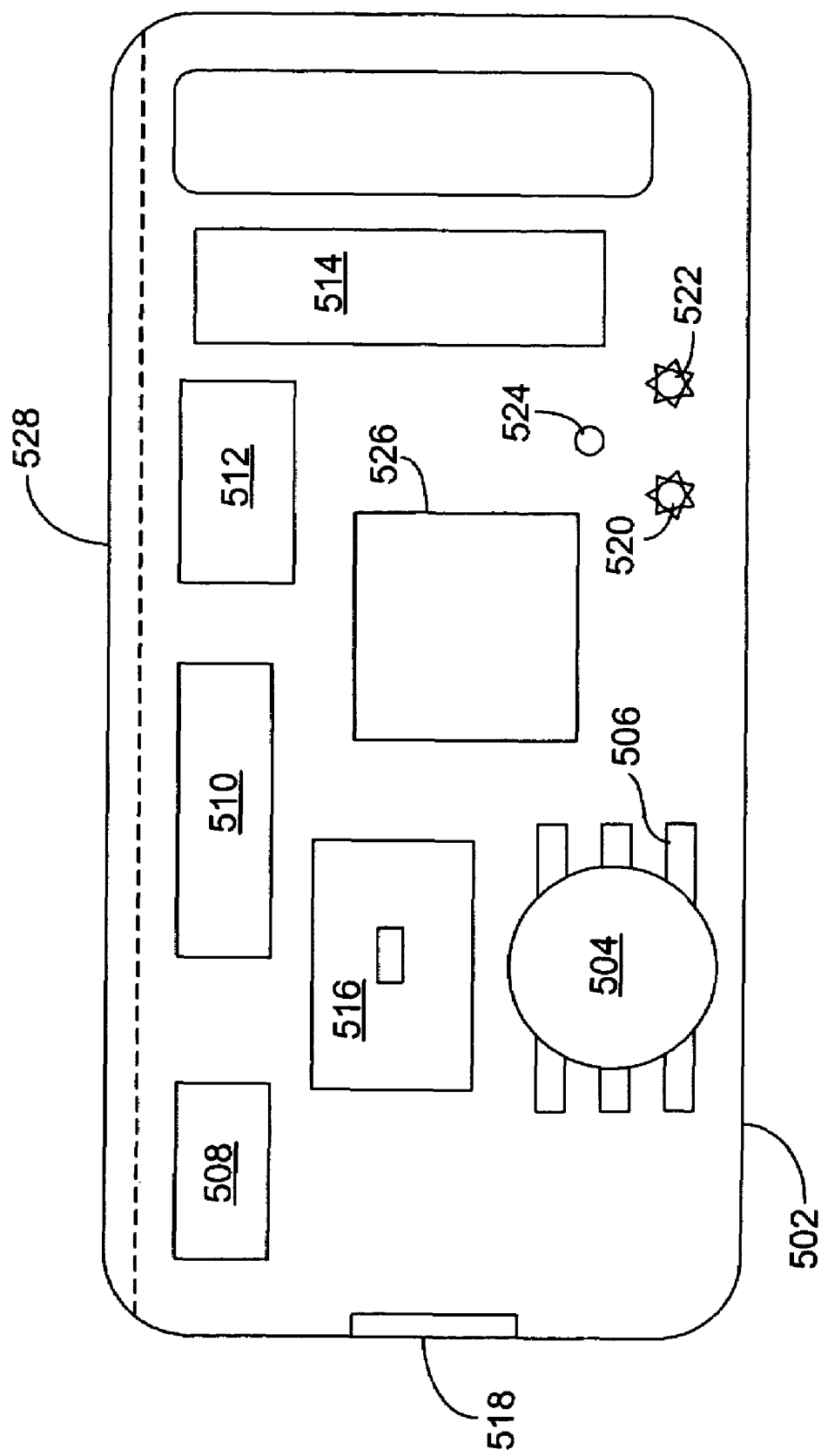
FIG. 6 illustrates a moisture sensor.

Referring to FIG. 6, a moisture sensor (e.g., 226 or 230) includes a housing 502 with several components mounted thereto. A moisture sensing element 504 is positioned proximate a plurality of openings 506 in the housing 502 that act as vents. Ambient air is allowed to pass through the vents to the moisture-sensing element 504. The moisture sensor also includes a memory storage unit 508, which may be an EEPROM device. The memory storage unit may be adapted to store, for example, data representing sensed moisture, a calculated remaining floor life value, electrical component part and lot numbers, moisture sensitivity information, etc. The moisture sensor also includes processing logic 510 for processing data in memory storage unit 508. The moisture sensor also includes an RS 232 serial port 518 for inputting data to the memory storage unit 508.

A radio frequency (RF) module 512 and antenna 514 are adapted to communicate data to a remote device (e.g. computer 232 or another moisture sensor) over a wireless communications channel. A hall effect sensor 516 is adapted to actuate transmission of data by the RF module 512 and the antenna 514. The RF module 512 may be, for example Linx model TXM-418-LC. The antenna 514 may be, for example, Linx model 418-SP1, single grounded line plane antenna. The computer 232 may be fitted with a corresponding antenna and RF module. For example, the computer may be fitted with RF module Linx model RX M-418-LC-5.

A green light emitting diode (LED) 520, a red LED 522 and a button 52W are accessible for viewing and manipulating by an operator from outside the housing 502. According to one embodiment, if the operator momentarily depresses the button 524, either the green LED 520 or the red LED 522 will illuminate. An illuminated green LED would indicate that the calculated reduction in floor life of an associated set of electrical components suggests that the set are suitable for exposure to reflow soldering. In contrast, an illuminated red LED would indicate that the associated electrical components could be susceptible to damage if exposed to reflow soldering conditions. Additionally, depressing the button for an extended period of time might reset the moisture sensor and clear some of the moisture exposure data from the memory storage unit 508.

A battery 526 provides power fore each of the components of the moisture sensor to operate. Alternatively, the moisture sensor could be hard-wired to an electrical power source. A dashed-line indicates a track 528 formed in the housing 502 for mating with an edge feature of an electrical component tray.

A number of implementations of the invention have been described. Nevertheless, it will be understood that various modifications may be made without departing from the spirit and scope of the invention. For example, multiple moisture sensors may be associated with a multiple trays of a single stack; each moisture sensor may be associated with a respective tray. Moreover, one moisture sensor may be associated with each of multiple different physical areas in a manufacturing facility. In that case, every time a tray is moved from one area to another, the operator might upload data collected by the first associated moisture sensor and create an association between the moved tray and the moisture sensor associated with its new location. Additionally, the moisture sensors may use various methods of calculating a reduction in floor life for electrical components over a given time period.

Moreover, upon adequate prompting, a moisture sensor may be configured to transmit an entire collection of moisture exposure data and electrical component identification data to the remote computer. In that instance, the remote computer may be adapted to calculate a floor life reduction based on the transmitted data. Various data may be manually entered into the remote computer in lieu of being automatically transmitted by the moisture sensor. Particular moisture sensors may be adapted for use with specific types of electrical components.

Additionally, an operator may couple a container with a first moisture sensor physically connected thereto onto a placement machine. In that instance, the first moisture sensor may be left in place to continue collecting moisture exposure data when the container is coupled to the machine. Once coupled to the placement machine, the first moisture sensor might be prompted by a triggering event to calculate a reduction in remaining floor life and to transmit that calculation to the remote computer. The pick head of the placement machine may be fitted with a magnetic element that passes near the first moisture sensor as a component is removed from the container. In that embodiment, the triggering event may be the passage of the pick head's magnetic element near the first moisture sensor.

Various features of the system can be implemented in hardware, software or a combination of hardware and software. For example, some features of the system can be implemented in computer programs executing on programmable computers. Each program can be implemented in a high level procedural or object oriented programming language to communicate with a computer system. Furthermore, each such computer program can be stored on a storage medium, such as read-only-memory (ROM) readable by a general or special purpose programmable computer or processor, for configuring and operating the computer when the storage medium is read by the computer to perform the functions described above.

Accordingly, other implementations are within the scope of the following claims.

What is claimed is:

1. A method of monitoring electrical component moisture exposure, the method comprising:
    calculating a remaining floor life value for a group of electrical component containers including a first container, based on an associated first moisture sensor's exposure to moisture;
    removing the first container from the group;
    creating an association between the removed first container and a second moisture sensor; and
    transferring the calculated remaining floor life value from the first moisture sensor for use with the second moisture sensor.

2. The method of claim 1 further comprising calculating, with the second moisture sensor, a remaining floor life value associated with the removed first container, based on the removed first container's exposure to moisture.

3. The method of claim 2 further comprising using the transferred remaining floor life value associated with the group as an initial value for calculating the remaining floor life value associated with the removed first container.

4. The method of claim 2 further comprising:
    recoupling the removed first container to the group of electrical component containers;
    creating a new association between the recoupled first container and the first moisture sensor; and
    transferring an updated remaining floor life value associated with the first container from the second moisture sensor to the first moisture sensor.

5. The method of claim 4 further comprising calculating, with the first moisture sensor, a remaining floor life value associated with the recoupled first container, based on the first moisture sensor's exposure to moisture, wherein the calculating the remaining floor life of the recoupled first container comprises using the remaining floor life value transferred from the second moisture sensor as an initial value for the calculation.

6. The method of claim 2 further comprising determining suitability of an electrical component of the removed first container for exposure to reflow soldering conditions based on a value of remaining floor life associated with the removed first container calculated by the second moisture sensor.

7. The method of claim 6 wherein the suitability determination is accomplished as a component is being removed from the first container for placement onto a circuit board.

8. The method of claim 6 further comprising reflow soldering a suitable electrical component from the removed first container to a circuit board.

9. The method of claim 6 further comprising interrupting reflow soldering activities upon an unfavorable suitability determination.

10. The method of claim 1 further comprising, after removing the first container from the group, calculating a remaining floor life value associated the group.

11. The method of claim 1 wherein transferring the calculated remaining floor life value comprises transferring the remaining floor life value to a computer that is coupled to the second moisture sensor.

12. The method of claim 11 further comprising:
    collecting moisture exposure data with the second moisture sensor, the data being associated with the removed first container's exposure to moisture;
    transferring the collected moisture exposure data to the associated computer; and calculating a remaining floor life associated with the removed first container, based on the transferred moisture data and using the transferred remaining floor life value as an initial remaining floor life value.

13. The method of claim 1 further comprising, prior to calculating the remaining floor life value associated with the group, creating an association between the first moisture sensor and the group of electrical component containers.

14. The method of claim 13 wherein creating the association comprises securing the first moisture sensor to a container in the group.

15. The method of claim 1 wherein creating the association between the removed first container and the second moisture sensor comprises placing the removed first container in an area proximate the second moisture sensor.

16. The method of claim 1 further comprising setting the first moisture sensor to an initial remaining floor life value of 100% prior to calculating the remaining floor life value associated with the group.

17. The method of claim 1 wherein the calculating is performed periodically while the first container is associated with the first moisture sensor.

18. The method of claim 1 wherein the calculating is performed approximately continuously while the first container is associated with the first moisture sensor.

19. The method of claim 1 further comprising initiating the transferring by actuating a switch at the first moisture sensor.

20. The method of claim 19 further comprising positioning a magnetic element proximate the first moisture sensor to actuate the switch.

21. A system for monitoring electronic component moisture exposure, the system comprising:
a first moisture sensor associated with a group of electrical component containers; and
a second moisture sensor associated with an electrical component placement machine;
wherein the first moisture sensors is adapted to:
sense exposure to moisture over time;
calculate, based on the sensed exposure, a remaining floor life value of the associated group of containers; and
transfer an updated remaining floor life value of the associated group to the second moisture sensor upon removal of a first container from the associated group of containers.

22. The system of claim 21 wherein the first moisture sensor comprises a hall effect sensor adapted to activate the transfer of the updated remaining floor life value when a magnetic element is positioned proximate the first moisture sensor.

23. The system of claim 21 wherein the second moisture sensor is adapted to:
receive the transferred remaining floor life value from the first moisture sensor;
set, as an initial floor life value of the removed first container, the received remaining floor life value; and
periodically update the floor life value, over time, based on the removed first container's exposure to moisture over time.

24. The system of claim 23 further comprising a computer coupled to the second moisture sensor, wherein the computer is adapted to determine suitability of components from the first tray for exposure to reflow conditions based on the updated floor life value.

* * * * *